(12) United States Patent
Watts

(10) Patent No.: US 12,422,490 B2
(45) Date of Patent: Sep. 23, 2025

(54) AUTOMOTIVE BATTERY DRAW MONITOR

(71) Applicant: Austin N. Watts, San Antonio, TX (US)

(72) Inventor: Austin N. Watts, San Antonio, TX (US)

( * ) Notice: Subject to any disclaimer, the term of this patent is extended or adjusted under 35 U.S.C. 154(b) by 199 days.

(21) Appl. No.: 18/362,159

(22) Filed: Jul. 31, 2023

(65) Prior Publication Data

US 2023/0375629 A1 Nov. 23, 2023

Related U.S. Application Data

(63) Continuation-in-part of application No. 17/354,184, filed on Jun. 22, 2021, now Pat. No. 11,747,402.

(51) Int. Cl.
| | |
|---|---|
| *G01R 31/3842* | (2019.01) |
| *G01R 22/06* | (2006.01) |
| *G01R 31/00* | (2006.01) |
| *G01R 35/04* | (2006.01) |

(52) U.S. Cl.
CPC ....... *G01R 31/3842* (2019.01); *G01R 22/065* (2013.01); *G01R 31/006* (2013.01); *G01R 35/04* (2013.01)

(58) Field of Classification Search
None
See application file for complete search history.

(56) References Cited

U.S. PATENT DOCUMENTS

2006/0145714 A1* 7/2006 Cruz ................... G01R 15/125
324/754.03

OTHER PUBLICATIONS https://www.parasiticdraintest.com/; EM Electric Motion; PDT Heartbeat 1001; Copyright 2015-2023; Aug. 8, 2023.

* cited by examiner

*Primary Examiner* — Jas A Sanghera
(74) *Attorney, Agent, or Firm* — Brandon T. Cook; Gunn, Lee & Cave, PC

(57) ABSTRACT

An automotive battery draw monitor for monitoring the parasitic draw on an automotive battery. The invention uses a fuse and a multi-meter to measure the voltage drop between the negative battery terminal and the negative battery cable. The invention is contained within a housing and powered via a power cable that connects the multi-meter to the positive terminal of the battery. The invention is grounded using a ground wire connected to the fuse.

7 Claims, 7 Drawing Sheets

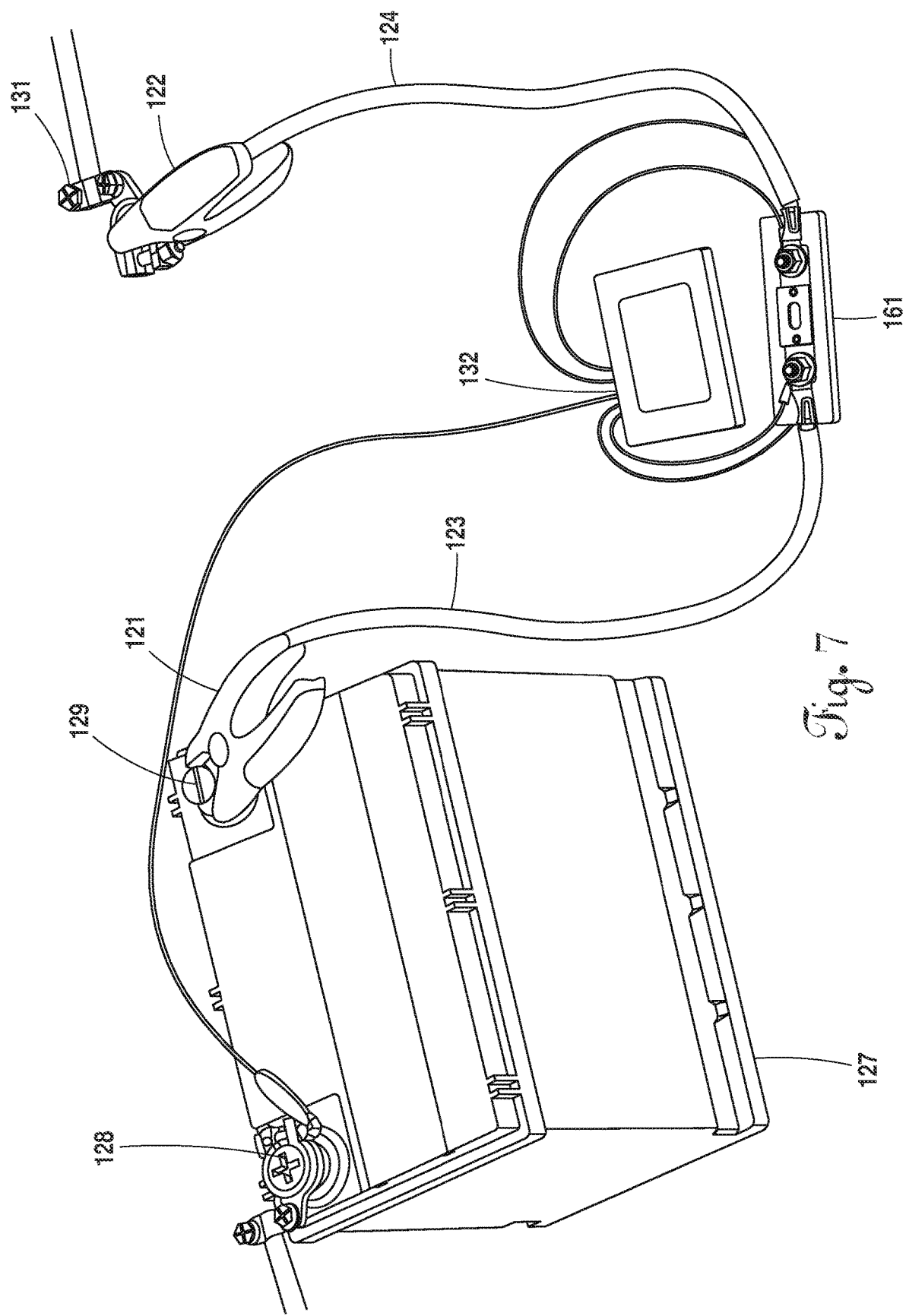

AUTOMOTIVE BATTERY DRAW MONITOR

CROSS-REFERENCES TO RELATED APPLICATIONS

This application is a continuation-in-part of U.S. application Ser. No. 17/354,184.

STATEMENT REGARDING FEDERALLY SPONSORED RESEARCH OR DEVELOPMENT

Not applicable.

BACKGROUND OF THE INVENTION

1. Field of the Invention

Parasitic draw is an excessive amount of electrical current flowing from a battery-powered device while the device is turned off. This can result in draining the battery to the point that the device will no longer turn on. Parasitic draw is a common and growing problem with newer vehicles due to their increasing complexity and presence of computer modules, each consuming electrical current that can add up to a very large parasitic draw. Because of this, most of these modules are programmed to enter a "sleep" state shortly after the ignition is turned off or the vehicle is locked. This is to ensure that the battery maintains a charge strong enough to start the engine. After turning off a vehicle, it can take just a few minutes or even up to 30 minutes before all computer modules are in their sleep states. Also, even after a computer module is asleep it may "wake up" occasionally to perform basic checks, depending on how it has been programmed. Excessive battery draw in most automotive applications is considered anything over 0.07 amps.

There are currently two different ways to check parasitic draw. The first is the use of an "amp clamp" which is a device that is installed around a cable and can measure the magnetic field generated by current flowing through the cable. From this it can calculate the amount of current flowing through the cable. The problem with using an amp clamp to measure parasitic draw is that they are not designed to measure very small amounts of current and are prone to false-positives due to electromagnetic interference when measuring at the bottom of their scale. Smaller, more accurate amp clamps are available but are so small they will not fit around the battery cables in an automotive application.

The other way to check parasitic draw is to disconnect the negative battery cable from the battery and connect a multi-meter or oscilloscope in series to directly measure the current flowing. This is extremely accurate, but most multi-meters and oscilloscopes only support a maximum of 10 amps of current. Late model vehicles will easily exceed 10 amps of current while the ignition is turned on, even with all electrical loads turned off. Even after turning off the ignition, the 10+ amp draw may persist for several minutes until all computer modules can be put into sleep states. Disconnecting, and then reconnecting the battery will restart this process. This makes it very difficult to check parasitic draw directly with a multi-meter or oscilloscope, as the current draw before the vehicle is asleep will overload the multi-meter's fuse and open the circuit, essentially disconnecting the battery again.

A workaround for this is to disconnect the negative battery cable from the battery and connect a high-current switch in series. With the switch closed, the vehicle is left alone and the sleep process starts. After a sufficient amount of time, a multi-meter or oscilloscope can be connected in parallel to the switch, and the switch can be turned to the open state, directing current through the multi-meter or oscilloscope. If the switch is switched prior to the vehicle completely going to sleep, the current draw could still be more than 10 amps and would result in blowing the fuse in the multi-meter, wasting an expensive fuse and starting the diagnostic process all over. Another issue with this method is if the vehicle "wakes up" while taking a reading, it can result in a blown fuse and wasted time. Something as simple as opening the door can wake a vehicle up.

SUMMARY OF THE INVENTION

Applicant's device makes checking parasitic draw quick and easy. Disconnect the negative battery cable from the battery and connect two heavy-duty clamps from Applicant's device to the battery terminal and cable, in series. Then connect a power clamp onto the positive battery terminal to power up the device. Applicant's automotive battery draw monitor can be used on any 12, 24 or 48 volt direct-current electrical systems to measure current flowing through the circuit.

Applicant's battery draw monitor does not require any of kind of switching from a high-current circuit to a low-current circuit as it supports up to two-hundred-fifty amps of current. This enables the user to not have to wait until the vehicle is asleep to start taking readings of the current flowing from the battery. It also allows the user to measure the current output of the vehicle's charging system by running the engine and applying loads, or even checking the output of a battery charger that is connected to the vehicle.

Not having to switch between a high-current and a low-current circuit saves time because the user does not have to guess when the vehicle is completely asleep. It saves the user from having to replace fuses for their meter and additional down-time from having to start the process over again. With accurate readings, even at very low currents, false-positives are avoided and parasitic draw can be quickly verified.

A first embodiment of Applicant's invention combines a multi-meter with a high-current electrical shunt manufactured to have a very specific resistance. The multi-meter measures voltage drop across the shunt by connecting two leads to both sides of the shunt and then uses the fixed resistance of the shunt to calculate the current flowing through the shunt. The multi-meter requires an external power supply to function and uses the vehicle's battery to power up. The positive power supply comes from the small power cable coming out of the multi-meter and is connected to the positive battery terminal of the vehicle.

The ground supply for the multi-meter comes from a small lead that is connected to the high-current shunt, on the side that connects to the battery. The placement of the ground lead on the side of the shunt that connects to the battery ensures that any current consumed by powering the meter does not flow through the shunt and will not be added to the total displayed by the meter, increasing accuracy which is essential when measuring currents so low. The meter itself only consumes approximately 0.005 amps and will not add significant draw to the battery, even if left on for extended periods, such as when checking for an intermittent parasitic draw.

Both sides of the shunt are connected to large, high-current cables with heavy duty clamps attached at the ends. These are for connecting to the negative battery terminal and battery cable after negative battery cable has been disconnected. This ensures all current flowing in or out of the battery can be accounted for.

A non-conductive case is assembled around the shunt, multi-meter and wires to prevent any short circuits to the vehicle body or exposed wires. Inside the case are locating lugs that sit snugly around the exposed bolts that connect the big cables and the shunt. These lugs firmly locate the shunt and keep it from sliding around inside the case when being operated.

A second embodiment of Applicant's invention comprises a high-resolution voltage meter paired with a fuse. The voltage meter can be used with any size fuse and may use larger fuses for heavy duty models. In the embodiment described in detail herein, a two-hundred-and-fifty amp fuse is used.

The manufacturing tolerances of fuses can slightly vary the electric resistance of each particular fuse. Consequently, the voltage meter must determine the exact resistance of the fuse being used via calibration. Calibration is accomplished by applying fifty mA of current to one side of the fuse lead. The current then returns to the meter via a ground lead on the opposite side of the fuse. After calibration, the voltage meter knows, and stores, the exact resistance of the fuse.

After calibration, Applicant's device can calculate any current flowing across the fuse by measuring the voltage drop and dividing by the resistance found during calibration. The device requires an external power source, and can get such power from the vehicle battery or other power source. The positive power supply comes from a power cable connecting the device to the positive battery terminal of the vehicle battery. The ground supply for the device comes from a lead that is connected to the fuse, on the side that connects to the battery. Such position of the ground lead ensures that any current consumed by powering the meter does not flow through the fuse and will not be added to the total displayed by the voltage meter, thus increasing the accuracy of the device which is essential when measuring relatively low amounts of current.

Both sides of the fuse are connected to large, high-current cables with heavy duty clamps at the ends. These high-current cables connect to the negative terminal of the battery and battery cable after negative battery cable has been disconnected. This ensures all current flowing in or out of the battery can be accounted for.

The entire device only consumes approximately 0.05 amps and will not add significant draw to the battery, even if the device is left on for extended period such as when the user is checking for an intermittent parasitic draw.

A non-conductive case is assembled around the fuse, multi-meter and wires to prevent any short circuits to the vehicle body or exposed wires. Inside the case are locating lugs that sit snugly around the exposed bolts that connect the big cables and the shunt. These lugs firmly locate the shunt and keep it from sliding around inside the case when being operated.

BRIEF SUMMARY OF THE DRAWINGS

FIG. 7 is a perspective view of the second embodiment of the battery draw monitor connected to a battery.

DETAILED DESCRIPTION

Figure 1:
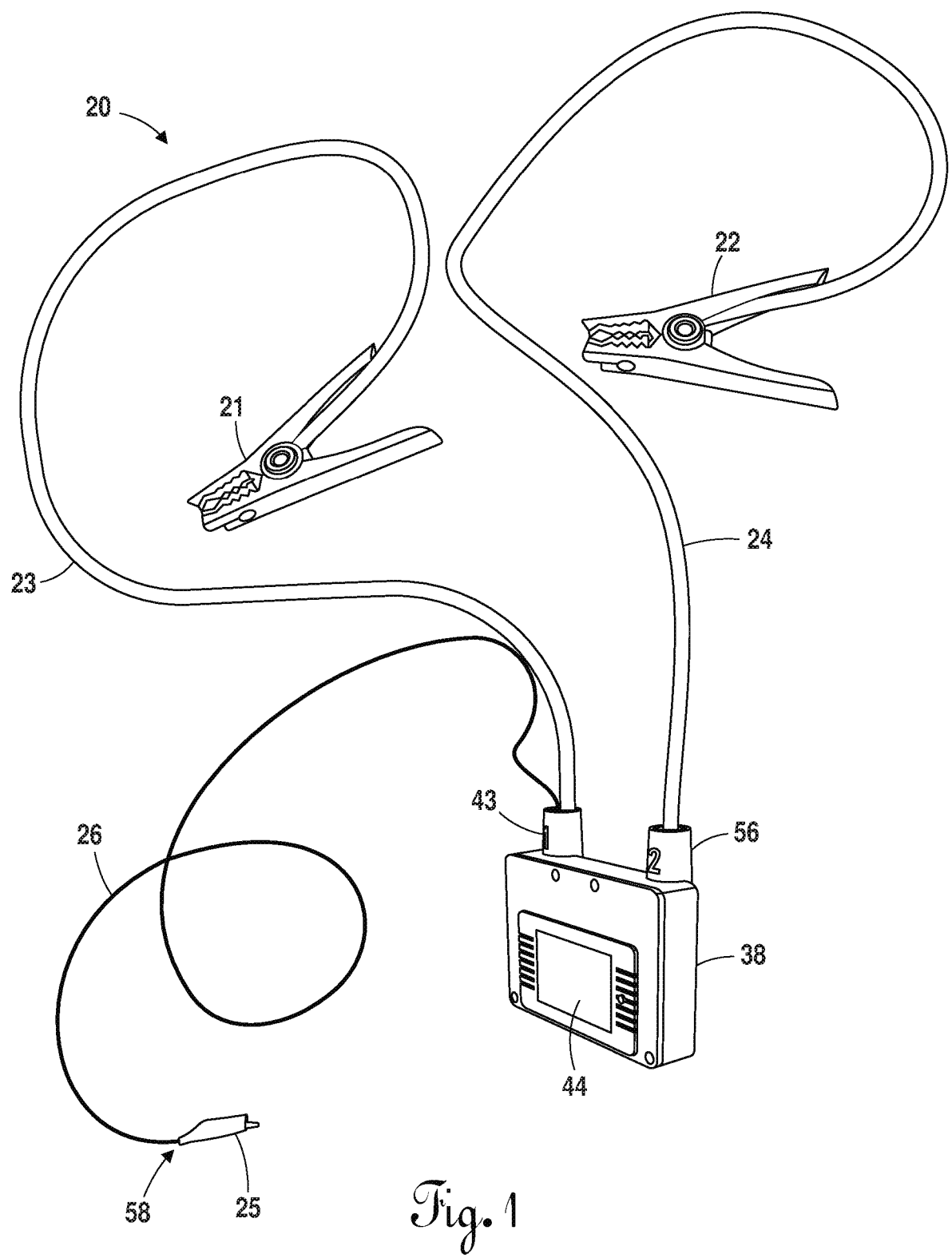
FIG. 1 is a perspective view of a first embodiment of the automotive battery draw monitor.
Figure 2:
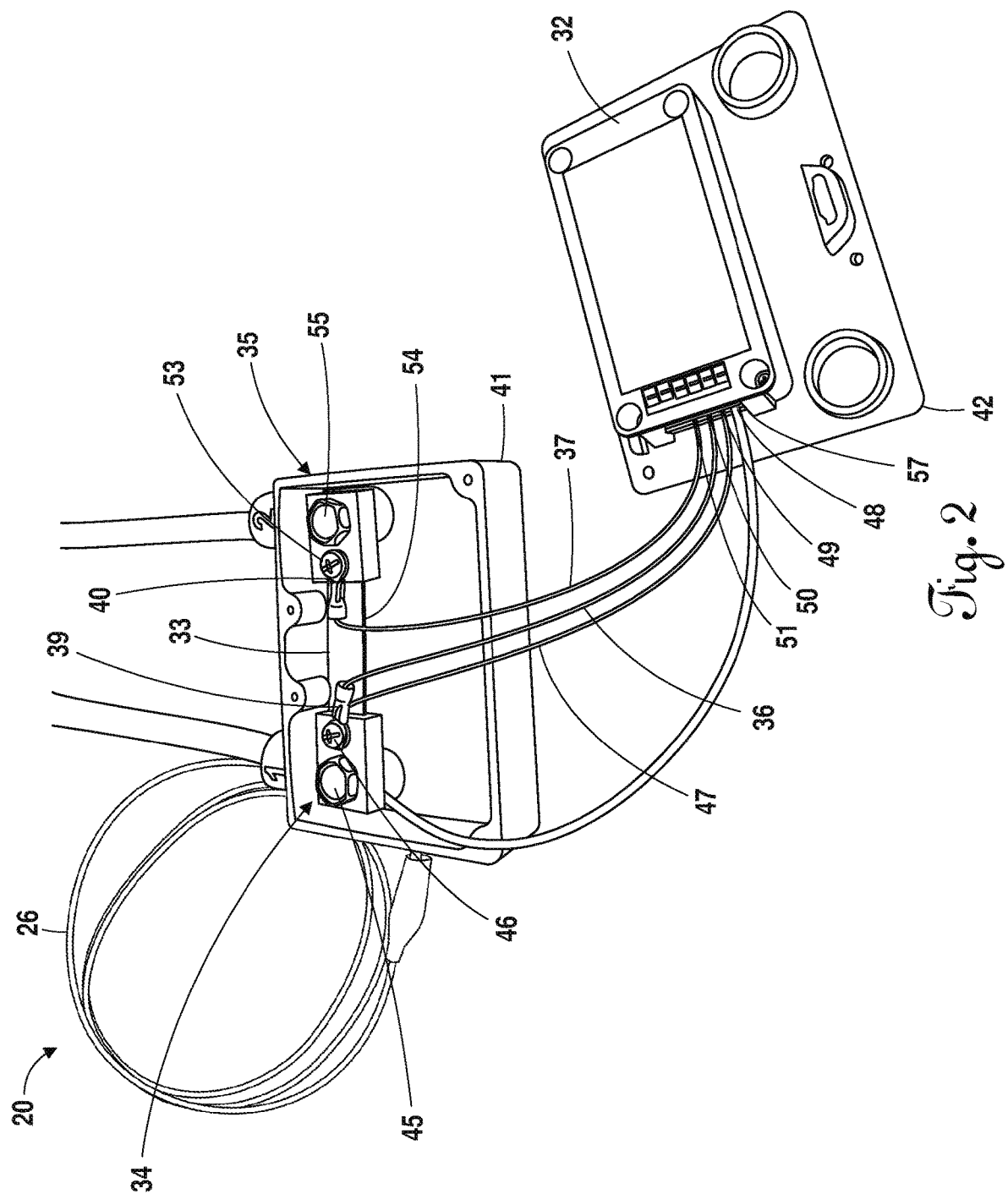
FIG. 2 is perspective view of the first embodiment of the automotive battery draw monitor with the housing opened to show interior components.

The structure of a first embodiment of the automotive battery draw monitor is described with reference to FIGS. 1-2. The automotive battery draw monitor 20 comprises a housing 38, multi-meter 32, shunt 33, first lug 39, second lug 40, ground lug 60, power cable 26, first clamp 21 and second clamp 22.

The housing 38 comprises a base 41, top 42, a first cable flange 43 and a second cable flange 56. The housing 38 is generally rectangular prism in shape. A cavity inside the housing 38 houses components of the automotive battery draw monitor 20. Cylindrical cable flanges 43 and 56 protrude from opposing sides of the housing 38 base 41. The top 42 of the housing 38 comprises a window through which the multi-meter screen 44 protrudes. The top 42 is connected to the bottom 41 by screws or other suitable attachment means such as a snap fit. In alternative embodiments, the housing may be a singular component without a separate top and bottom.

The multi-meter 32 is positioned within the housing 38. A commercially available multi-meter can be used such as DC Multifunction Battery Monitor Meter, 0-200V, 0-100 A (Widely Applied to 12V/24V/48V RV/Car Battery) LCD Display Digital Current Voltage Solar Power Meter Multimeter Ammeter Voltmeter. Those skilled in the art understand that other types of battery meters could be implemented.

The multi-meter 32 comprises a display screen 44, a power input 48, a ground input 49, a first lead input 50, and a second lead input 51. Those skilled in the art understand the multi-meter 32 could have additional desirable inputs.

The high current shunt 33 is also positioned within the interior of the housing 38. In a first embodiment of Applicant's battery draw monitor, a commercially available 100 A shunt is implemented. Those skilled in the art understand that other suitable shunts could be used. However, a high current shunt with a specific resistance provides the most accurate results.

The shunt is affixed to the base 41 of the housing. The shunt 33 has a first end 34, a second end 35, and a bridge 54. The shunt 33 comprises a first cable bolt 45 on the first end 34 proximate the terminal end. The shunt 33 comprises a first lead bolt 46 on the first end 34 between the first cable bolt 45 and the bridge 54. The shunt 33 comprises a second cable bolt 55 proximate the terminal end. The shunt 33 comprises a second lead bolt 56 between the second cable bolt 55 and the bridge 54.

A ground lead 47 electrically connects the ground input 49 of the multi-meter 32 with the shunt 33. The ground lead 47 is electrically and physically connected to the first lead bolt 46 on the first end 34 of the shunt 33. A ground lug 60 connects the ground lead 47 to the first lead bolt 46.

A first voltage lead 36 electrically connects the first lead input 50 of the multi-meter 32 with the shunt 33. The first voltage lead 36 is electrically connected and physically connected to the first lead bolt 46 on the first end 34 of the shunt 33. A first lug 39 connects the first voltage lead 36 to the first lead bolt 46.

A second voltage lead 37 electrically connects the second lead input 51 of the multi-meter to the shunt 33. The second voltage lead 37 is electrically and physically connected to the second lead bolt 53 on the second end 35 of the shunt 33. The second lug 40 connects the second voltage lead 37 to the second lead bolt 53.

A power cable 26 is electrically connected to the power input 48 of the multi-meter 32. The power cable 26 comprises a first end 57 and a second end 58. The first end 57 of the power cable 26 is electrically and physically connected to the power input 48 of the multi-meter. The power cable 26 extends away from the multi-meter and through the first cable flange 43 so that the second end 58 of the power cable 26 is outside the housing 38. A power cable clamp 25 is on the terminal end of the second end 58 of the power cable 26.

A first clamp cable 23 is electrically and physically connected to the first end 34 of the shunt 33. The first clamp cable extends from the shunt 33 and through the first cable flange 43. A first clamp 21 is integral the terminal end of the first clamp cable 23.

A second clamp cable 24 is electrically and physically connected to the second end 35 of the shunt 33. The second clamp cable extends form the shunt 33 and through the second cable flange 56. A second clamp 22 is integral the terminal end of the second clamp cable 24. The first and second clamps 21, 22 are heavy duty clamps used in jumper cables.

Figure 3:
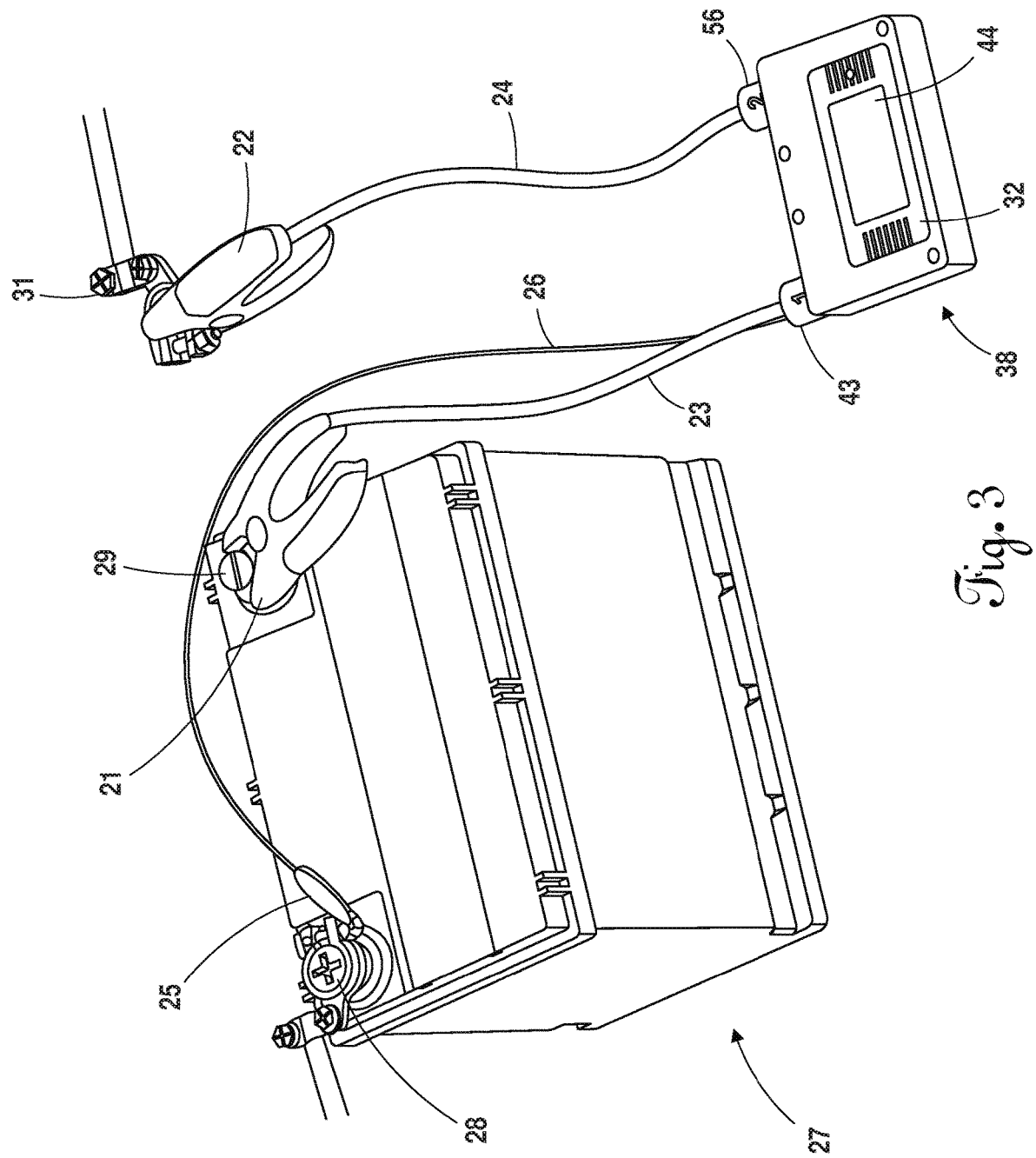
FIG. 3 is a perspective view of the first embodiment of the automotive battery draw monitor connected to a battery.
Figure 4:
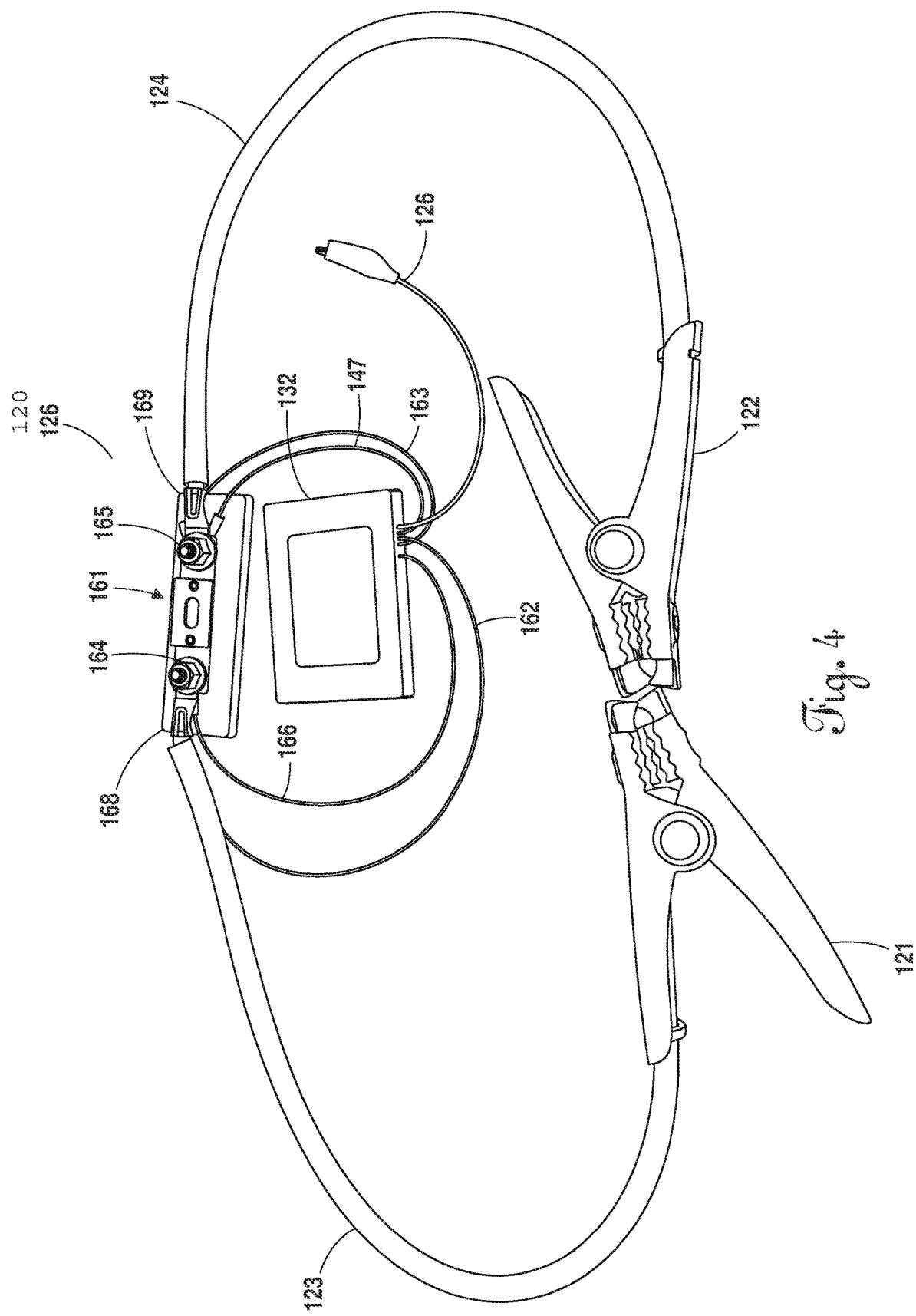
FIG. 4 is a perspective view of a second embodiment of the automotive battery draw monitor.
Figure 5:
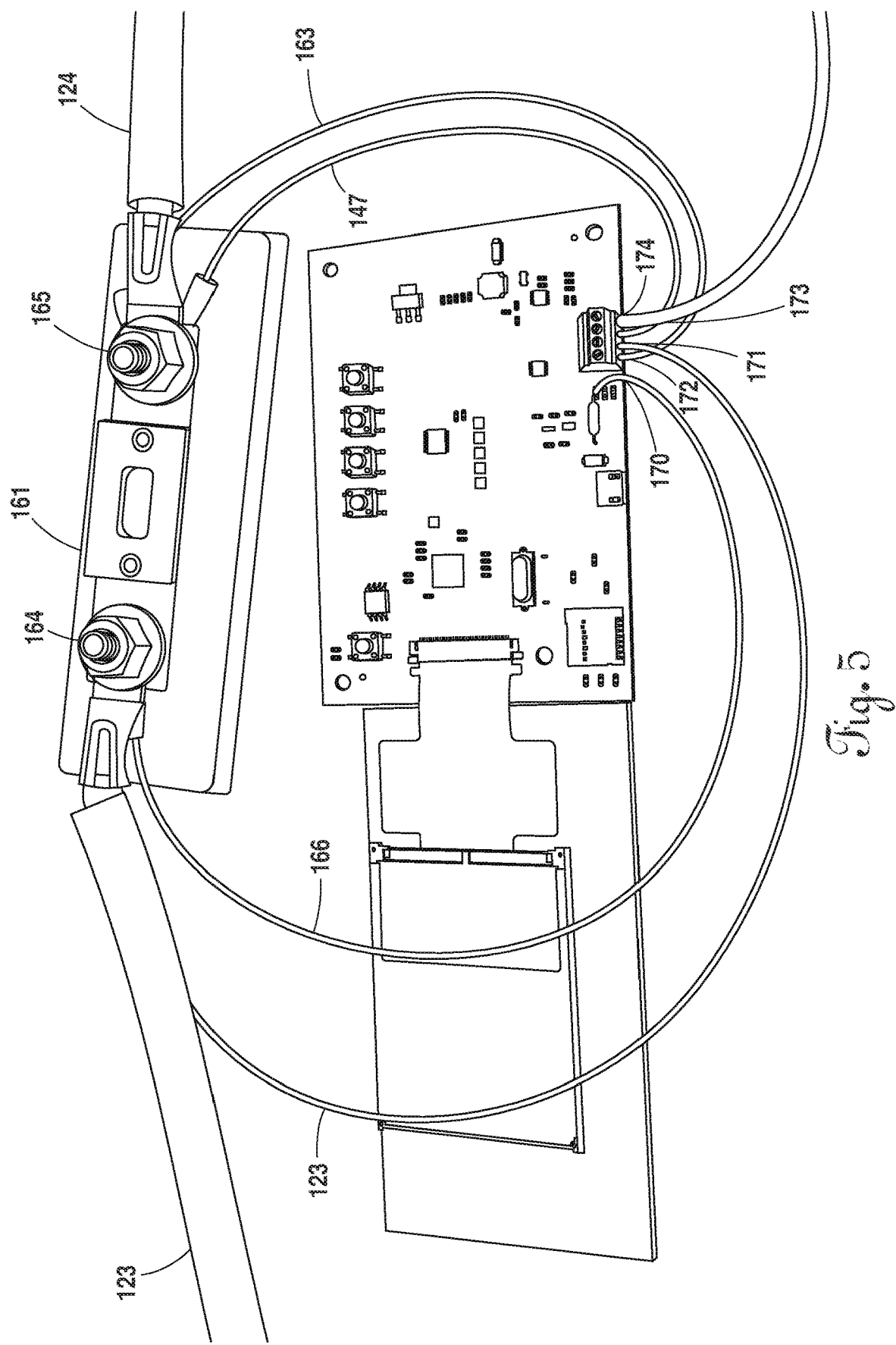
FIG. 5 is a zoomed in perspective view of the second embodiment of the automotive battery draw monitor with the housing opened to show interior components.
Figure 6:
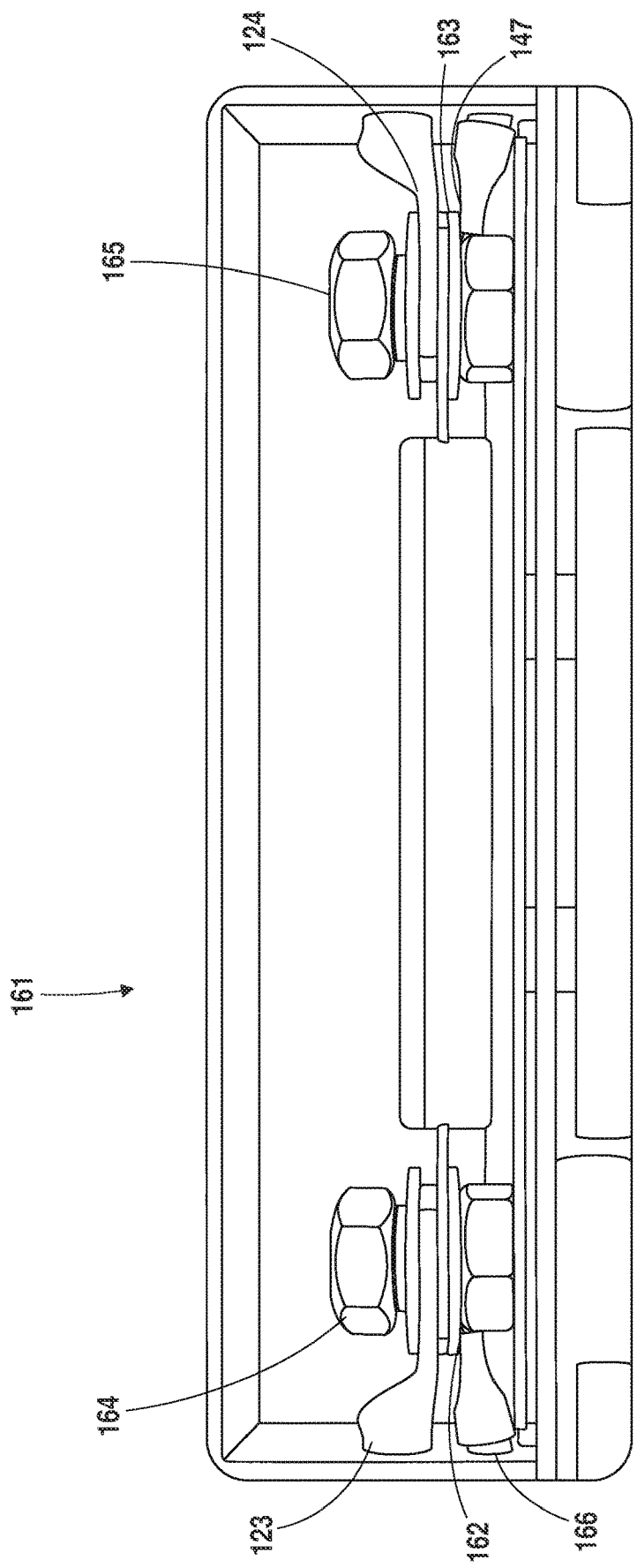
FIG. 6 is a zoomed in side view of a fuse of the second embodiment of the automotive battery draw monitor.

The operation of the automotive battery draw monitor 20 is described with reference to FIG. 3. The negative battery cable 31 is disconnected from the negative battery terminal 29 of a battery 27. The first clamp 21 is clamped onto the negative battery terminal 29. The second clamp 22 is connected to the detached negative battery cable 31. The power clamp 25 is connected to the positive terminal 28 of the battery 27.

The multi-meter is powered using power delivered to the multi-meter via the power cable 26. No power source is required other than the battery being tested. Current from the positive terminal of the battery travels through the power cable 26 and into the multi-meter via the power input, therefore powering the multi-meter.

Once the multi-meter 32 is connected to a power source, the multi-meter 32 measures voltage drop across the shunt 33. The multi-meter 32 measures the voltage at the first end 34 of the shunt 33 via the first lead 50. The multi-meter 32 measures the voltage at the second end 35 of the shunt 33 via the second lead 51. The multi-meter 33 uses the fixed resistance of the shunt to calculate the current flowing through the shunt.

The multi-meter 33 presents the results in a screen readable format displayed via the screen 44.

Grounding for the multi-meter 32 is provided by the ground lead 47. The ground lead 47 is connected to the first end 34 of the shunt 33, which ensures the current used to power the multi-meter 32 does not flow through the shunt 33 and will not be picked up by the multi-meter 32 when measuring draw on the battery.

To achieve the most accurate results, it is critical that the first clamp be connected to the negative battery terminal and the second clamp be connected to the detached negative battery cable. This excludes the power supply from the circuit being measured by the shunt and ensures any current consumed by the monitor 20 is not included in the results.

Current draw lower than 20 mA is considered an acceptable level of draw on a vehicle battery, especially on late model vehicles.

The automotive battery draw monitor 20 can also be used to make quick and basic checks of a vehicle's charging system. Connect the battery draw monitor 20 to the battery as described above, then start the vehicle engine and turn on all electrical loads (exterior lights, windshield defrosters, seat warmers, etc.). Increase the engine RPM to 2500 RPMs and use the battery draw monitor 20 to check that voltage is above 13.3 volts.

The automotive battery draw monitor 20 can also be used to check the current draw on a vehicle's starter circuit. Starters typically pull a lot more than 100 amps of current, so a higher amp shunt may be necessary. However, even an automotive battery draw monitor 20 with a 100 amp shunt can take momentary readings of higher currents. The automotive battery draw monitor 20 has a slower refresh rate than most multi-meters, so it will be necessary to disable fuel delivery on the vehicle prior to testing starter current. Pulling the fuel pump fuse can be a simple and reliable way to disable fuel. On direct-injected engines, also remember to run engine after disconnecting fuel until it stalls. This ensures all fuel in the high pressure rails is depleted. Once fuel delivery has been disabled, connect the automotive battery draw monitor 20 to the battery as described above. Crank the engine for no longer than 4 seconds and the automotive battery draw monitor will measure the starter current and display the results on the screen 44.

The structure of a second embodiment of the automotive battery draw monitor 120 is described with reference to FIGS. 4-7. The battery draw monitor 120 comprises a multi-meter 132, a fuse 161, power cable 126, first clamp 121, first clamp cable 123, second clamp 122, second clamp cable 124, a first sensing wire 162, a second sensing wire 163, ground supply 147, a calibration wire 166, a first bolt 164, and a second bolt 165.

The fuse 161 has a first side 168 and a second side 169. The first bolt 164 is connected to the first side 168 of the fuse 161 and the second bolt 165 is connected to the second side 169 of the fuse 161.

The multi-meter 132 has a calibration input 170, a first sensing input 171, a second sensing input 172, a ground input 173, and a power input 174. The multi-meter could alternatively be a voltmeter or other type of device that can detect voltage.

The power cable 126 connects to, and is in electrical communication with, the power input 174 of the multi-meter.

A first end of the calibration wire 166 connects to, and is in electrical communication with, the calibration input 170 of the multi-meter 132. The second end of the calibration wire 166 connects to, and is in electrical communication with, the first bolt 164. A lug or other suitable connecting device can be used to connect the second end of the calibration wire 166 to the first bolt 164.

The first sensing wire 162 connects to, and is in electrical communication with, the first sensing input 171 of the multi-meter 132. The second end of the first sensing wire 162 connects to, and is in electrical communication with, the first bolt 164. A lug or other suitable connecting device can be used to connect the second end of the first sensing wire 162 to the first bolt 164.

The second sensing wire 163 connects to, and is in electrical communication with, the second sensing input 172 of the multi-meter 132. The second end of the second sensing wire 163 connects to, and is in electrical communication with, the second bolt 165. A lug or other suitable connecting device can be used to connect the second end of the first sensing wire 163 to the second bolt 165.

The ground supply 147 connects to, and is in electrical communication with, the ground input 173 of the multi-meter 132. The second end of the ground supply connects to, and is in electrical communication with, the second bolt 165. A lug or other suitable connecting device can be used to connect the second end of the ground supply 147 to the first bolt 165. The ground supply is on the side of the fuse 161 that connects to the battery 127. This positioning ensures that any current consumed by powering the meter 132 does not flow through the fuse 161 and will not be added to the voltage drop calculated by the battery draw monitor 120.

The first clamp 121 connects to, and is in electrical communication with, a first clamp cable 123. The opposing end of the first clamp cable 123 connects to, and is in electrical communication with, the first bolt 164 of the fuse 161. A lug or other suitable connecting device can be used to connect first clamp cable 123 to the first bolt 164.

The second clamp 122 connects to, and is in electrical communication with, a second clamp cable 124. The opposing end of the second clamp cable 124 connects to, and is in electrical communication with, the second bolt 165 of the fuse 161. A lug or other suitable connecting device can be used to connect second clamp cable 124 to the second bolt 165.

Operation of the second embodiment of the battery draw monitor 120 is described with reference to FIGS. 4-7.

The fuse 161 must be calibrated before the battery draw monitor 120 can be accurately used because the manufacturing tolerances of fuses can vary the electrical resistance. The battery draw monitor 120 must be calibrated to determine the exact resistance of the fuse 161.

The battery draw monitor 120 is calibrated as follows. The multi-meter 132 is powered by connecting the power cable 126 to the positive terminal of a battery. The multi-meter 132 can be powered by the battery 127 being tested, or it could be powered by a standalone battery. The first clamp 121 is connected to the negative terminal 129 of the battery 127.

The multi-meter 132 has a menu with "calibration" as an option. When the user selects the "calibration" option, the multi-meter applies a calibration current to the fuse 161 via the calibration wire 166 to the first bolt 164. The current travels across the fuse 161, then returns to the multi-meter 132 via the second bolt 165, ground supply 147, and ground input 173. The calibration current can be between 50-150 mA.

The multi-meter 132 measures the voltage drop across the fuse 161 from the calibration current via measurements from the first sensing wire 162 connected to the first bolt 164 and the second sensing wire 163 connected to the second bolt 165. The multi-meter 132 then records and stores the exact resistance of the fuse 161.

The battery draw monitor 120 can now accurately measure the current flowing across the fuse 161 by measuring the voltage drop and dividing the voltage drop by the calculated calibration resistance of the fuse 161.

The negative battery cable 131 is disconnected from the negative battery terminal 129 of a battery 127. The first clamp 121 is clamped onto the negative battery terminal 129 of the battery 127. The second clamp 122 is connected to the detached negative battery cable 131.

The multi-meter 132 measures voltage drop across the fuse 161. The multi-meter 132 measures the voltage at the first end 168 of the fuse 161 via the first sensing wire 162. The multi-meter 132 measures the voltage at the second end 169 of the fuse 161 via the second sensing wire 163. The multi-meter 132 measures the drop in voltage from the voltage calculated on the first end 168 of the fuse 161 compared to the second end 169 of the fuse. The multi-meter uses the resistance calibration of the fuse calculated during calibration to calculate the current flowing through the fuse.

The multi-meter 132 presents the results in a screen readable format displayed via a screen on the multi-meter.

The current calculated is the power draining, i.e., parasitic draw, from the battery 127.

The automotive battery monitor 120 described herein can also distinguish between current flowing away from the battery or to the battery (for example if the alternator was charging the battery). The automotive battery draw monitor 120 described herein can also be used to check charging systems of a vehicle and perform general testing and diagnostics on a vehicle's electrical system.

I claim:

1. An automotive battery draw monitor comprising:
   a multi-meter, a first clamp, a second clamp, a first clamp cable, a second clamp cable, a power cable, a calibration wire, a first sensing wire, a second sensing wire, a ground supply wire, and a fuse;
   the fuse has a first end, second end, first bolt, and a second bolt;
   the first clamp cable is connected to the first bolt;
   the second clamp cable is connected to the second bolt;
   the calibration wire is connected to the first bolt;
   the first sensing wire is connected to the first bolt;
   the second sensing wire is connected to the second bolt;
   the ground supply wire is connected to the second bolt.

2. The automotive battery draw monitor of claim 1 wherein:
   the multi-meter has a calibration input, first sensing input, second sensing input, power input, and ground input;
   the calibration wire connects to the calibration input;
   the first sensing wire connects to the first sensing input;
   the second sensing wire connects to the second sensing input;
   the power cable connects to the power input; and
   the ground supply wire connects to the ground input.

3. A method for measuring the draw on an automotive battery comprising the following steps:
   calibrating a fuse of an automotive battery draw monitor;
   said fuse having a first bolt and a second bolt;
   said automotive battery draw monitor having a first clamp, a first clamp cable connected to the first clamp and the first bolt of the fuse, a second clamp, a second clamp cable connected to the second clamp and the second bolt of the fuse, and a multi-meter comprising a power input, a power cable, a calibration wire connected to the first bolt of the fuse, a first sensing wire connected to the first bolt of the fuse, a second sensing wire connected to the second bolt of the fuse, and a ground supply connected to the second bolt of the fuse;
   connecting the power cable of the multi-meter to a power source;
   connecting the first clamp to a negative terminal of a battery;
   the multi-meter sending a calibration current to the first bolt of the fuse via the calibration wire;
   the current traveling across the fuse to the second bolt;
   the current returning to the multi-meter via the ground supply; and the multi-meter measuring the voltage drop across the fuse by measuring the current at the first bolt via the first sensing wire and the second bolt via the second sensing wire.

4. The method for measuring the draw on an automotive battery of claim 3 further comprising:
- disconnecting a negative battery cable from the negative terminal of the battery;
- connecting the first clamp to the negative terminal of the battery;
- connecting the second clamp to the negative battery cable;
- measuring the voltage drop across the fuse by measuring the voltage at a first end of fuse, measuring the voltage at a second end of the fuse, and measuring the difference.

5. The method of claim 4 wherein:
the multi-meter displays the voltage measurement in a screen readable format displayed via a multi-meter screen.

6. The method of claim 4 wherein the multi-meter is powered via the power cable electrically connecting the multi-meter to a positive terminal of said battery.

7. The method of claim 3 wherein the calibration current is in the range of 50-150 mA.

* * * * *